United States Patent [19]

Hellé

[11] 4,020,426
[45] Apr. 26, 1977

[54] TEMPERATURE COMPENSATION CIRCUIT FOR CRYSTAL OSCILLATOR

[75] Inventor: Jacques Hellé, Sartrouville, France

[73] Assignee: Compagnie d'Electronique et de Piezoelectricite C.E.P.E., France

[22] Filed: Sept. 2, 1975

[21] Appl. No.: 609,809

[30] Foreign Application Priority Data

Sept. 6, 1974 France .............................. 74.30338

[52] U.S. Cl. .............................. 331/158; 331/176
[51] Int. Cl.² ...................... H03B 5/04; H03B 5/32
[58] Field of Search ................. 331/66, 116 R, 158, 331/176

[56] References Cited

UNITED STATES PATENTS

| | | | |
|---|---|---|---|
| 3,054,966 | 9/1962 | Etherington | 331/176 X |
| 3,200,349 | 8/1965 | Bangert | 331/116 R |
| 3,581,236 | 5/1971 | Berman | 331/116 R |

*Primary Examiner*—Siegfried H. Grimm
*Attorney, Agent, or Firm*—Cushman, Darby & Cushman

[57] ABSTRACT

A crystal-controlled oscillator whose frequency is regulated as a function of temperature and having a feedback loop with a capacitor whose capacitance is electrically variable, to which capacitor a variable electrical compensating signal varying in accordance with a third-degree law as a function of temperature, is applied. The compensating circuit in accordance with the invention produces a signal of this kind at its terminals by three units respectively comprising three thermistors $R_{T1}$, $R_{T2}$, $R_{T3}$, each unit being specifically designed to create the signal corresponding to a given arcuate portion of the total graph function. The applications are in particular in the field of portable radio transmitters.

5 Claims, 7 Drawing Figures

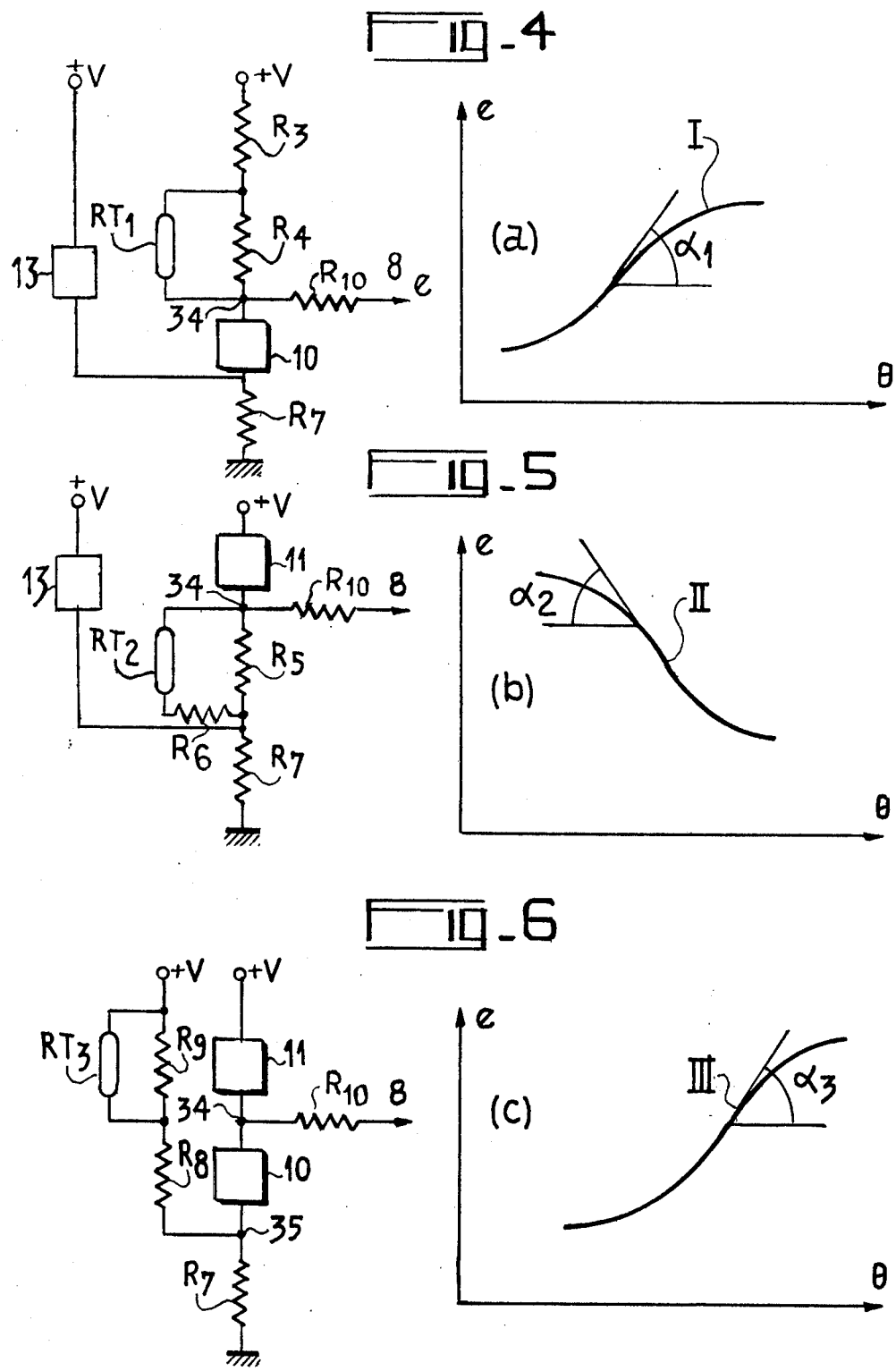

TEMPERATURE COMPENSATION CIRCUIT FOR CRYSTAL OSCILLATOR

The present invention relates to crystal-controlled oscillators whose frequency is regulated as a function of temperature. These oscillators essentially comprise an amplifier whose output is connected to its input across a circuit containing an oscillating piezoelectric crystal, the gain of the system, with the feedback loop thus created, being greater than unity in order to meet the conditions of self-oscillation; regulation of the frequency as a function of temperature is achieved by connecting in series with the crystal, a capacitor of suitable capacitance which can be varied as a function of a voltage applied to its terminals, and by producing said voltage, normally referred to as the "compensating signal", in a compensating circuit which includes a temperature-sensitive element.

However, the known compensating circuits do not make it possible in the industrial context to achieve complete frequency regulation in the frequent situation where the oscillating crystal has been cut in a manner which is particularly advantageous vis-a-vis certain aspects, this cut being known as an AT cut; with this kind of cut, the thermal drift $\Delta f/f$ of the frequency $f$ of the crystal, takes the form of a third-degree algebraic curve.

In the latter case, it is therefore necessary to create a compensating signal which also varies in accordance with a third-degree function, a solution which leads to known kinds of compensating circuits which are difficult and expensive to produce by virtue of the high precision and stability required in the signal, and the special characteristics required of certain components such as the temperature-sensitive elements or thermistors.

The present invention is concerned with a device which is not open to these drawbacks.

Basically, in accordance with the invention, the curve corresponding to the third-degree law of variation of the compensating signal, is split into three arcs, by means of three separate circuits each with a temperature-sensitive element.

More precisely, the invention relates to a crystal-controlled oscillator whose frequency can be regulated within a wide range of temperatures and which comprises on the one hand an oscillating circuit in the form of a feedback loop, comprising an amplifier, a piezoelectric oscillator and an element whose reactance is variable as a function of electrical quantities or signals, and on the other hand a compensating circuit comprising elements a characteristic electrical quantity of which depends upon the temperature, said circuit furnishing a compensating electrical quantity or signal, and wherein said circuit comprises two terminals, one of which in operation is maintained at a fixed potential by a divider bridge, and the other being at an applied potential which is variable as a function of the temperature, and the first and second of said temperature-sensitive elements being connected by one of their ends to said other terminal, their other ends being respectively connected to two divider bridges of which one comprises a third one of said elements, the three bridges being connected to the terminals of an electrical energy source.

The invention will be better understood from a consideration of the ensuing description and from a reference to the attached drawings in which.

Figure 3:
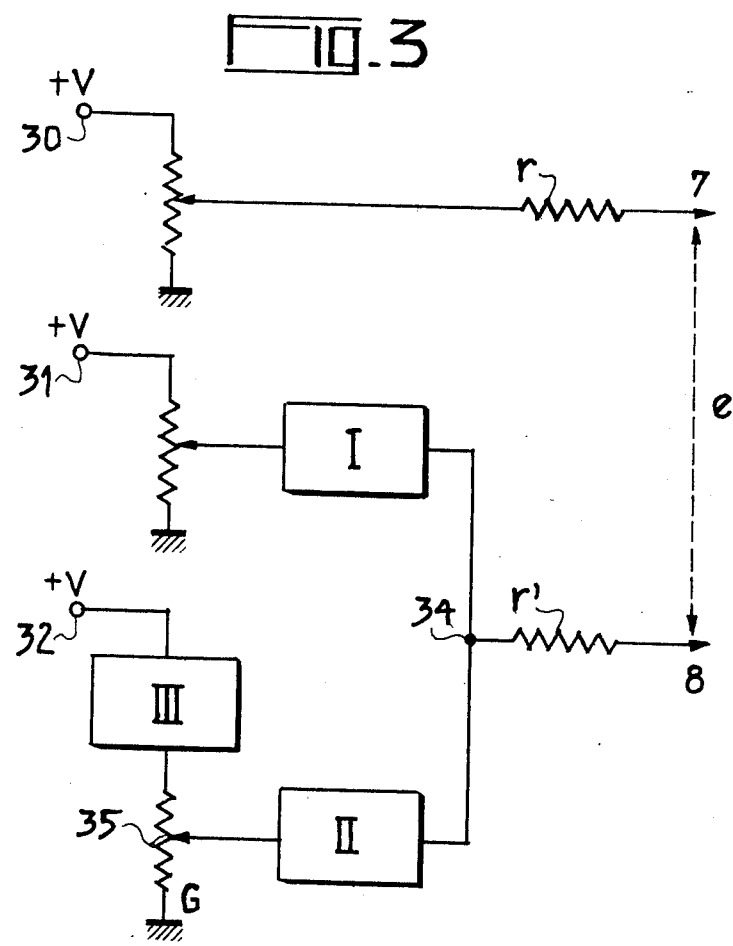
Figure 2:
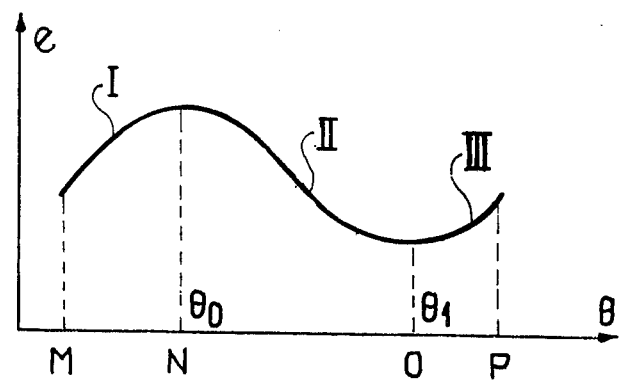
FIG. 2 illustrates a diagram showing the variations in a compensating voltage which can be applied to the circuit of FIG. 1.
Figure 7:
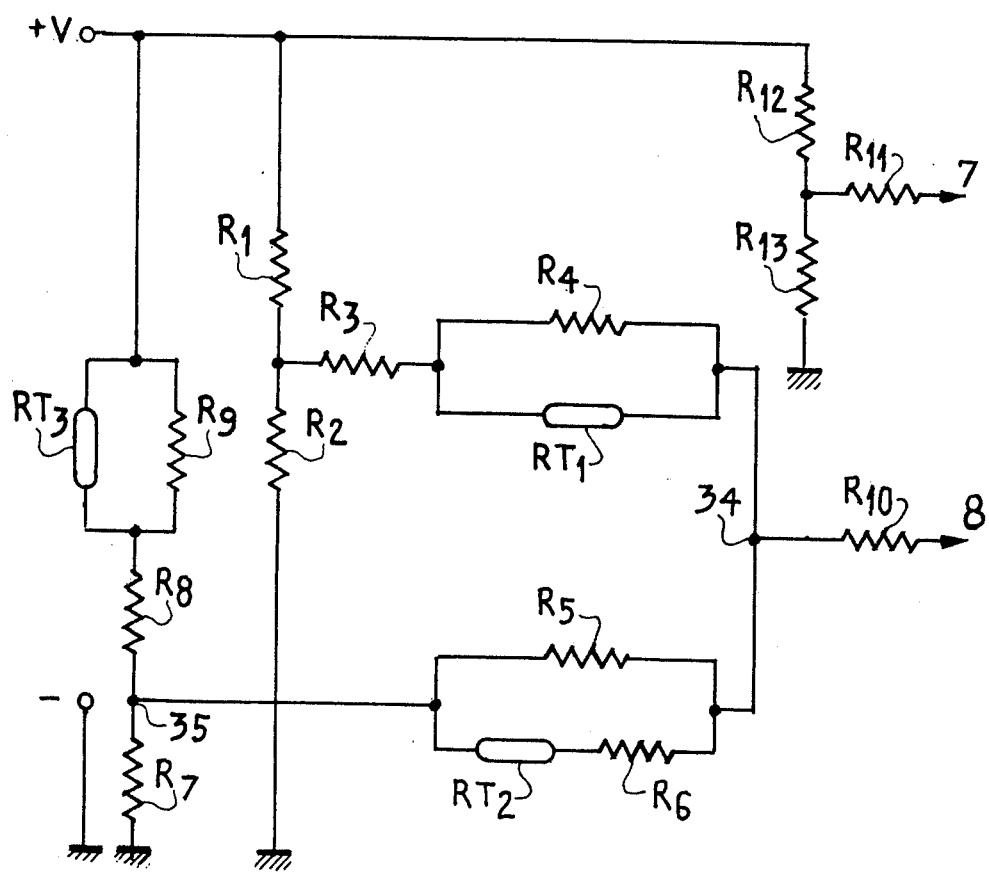

FIG. 3 schematically illustrates a circuit creating a compensating voltage in accordance with the diagram of FIG. 2;

FIGS. 4, 5 and 6 illustrate elements of the compensating circuit which forms part of the invention;

FIG. 7 illustrates the overall compensating circuit in accordance with the invention.

Figure 1:
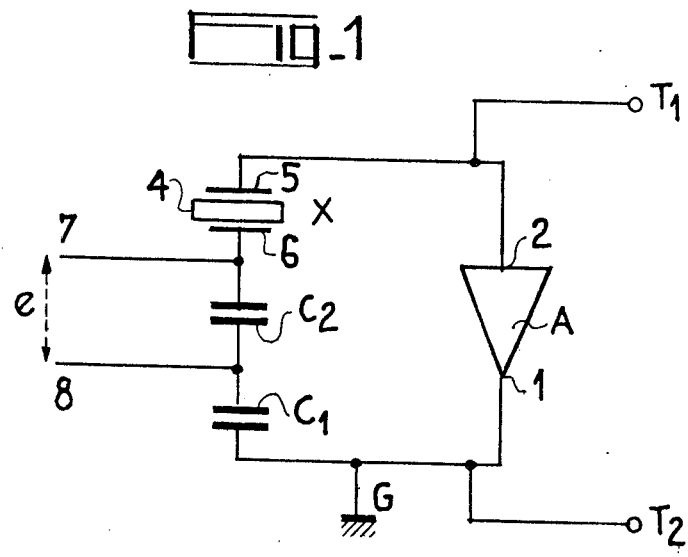
FIG. 1 illustrates part of the circuit of the crystal-controlled oscillator forming the object of the invention.

FIG. 1 illustrates one embodiment of part of the crystal-controlled oscillator circuit forming the object of the invention, namely, as indicated earlier, the oscillatory circuit and feedback loop, itself.

It essentially comprises an amplifier A shown schematically without supply sources for reasons of simplification, the input 2 and the output 1 of which are connected together by means of a crystal 4 with electrodes 5 and 6, and two capacitors C1 and C2, C2 having a capacitance which depends upon the voltage applied across its two terminals. This kind of capacitor is normally sold under the trademark VARICAP but can also be constituted by any electrical component whose capacitance is variable as a function of a voltage, as for example a transistor.

In the case of VARICAP capacitors, the voltages $e$ controlling the variation in capacitance, these voltages being known as the bias voltages, are directly applied across the electrodes, and in the embodiment of FIG. 1 are consequently applied between the points 7 and 8 of capacitor C2. In practice, so that the bias voltage sources whose internal impedance is usually low, do not interfere with the operation of the oscillator circuit with the feedback loop, this being a circuit which is normally of high impedance, the bias voltages are applied across very high resistance resistors to the capacitors.

FIG. 2 illustrates the values of the compensating voltage $e$, in the form of a schematic diagram, as a function of the temperature $\theta$ of the crystal. To obtain these values, measurements were taken point by point between $-15°$ and $+70°$ C for example, of the values of $e$ required in order to obtain a constant frequency on the part of the oscillator shown in FIG. 1. An examination of the overall graph obtained shows that it is a third-degree algebraic curve.

The graph can be split into three parts.

A first part I corresponds to the low temperature range MN, and having a positive slope. The second part II follows a peak at the temperature $\theta_o$, corresponding to the medium temperature range NO, and having a negative slope. Finally, a third part III follows a minimum corresponding to the temperature $\theta_1$, for the high temperatures OP.

In accordance with the invention, the voltage $e$ is developed in accordance with these variations in a compensating circuit constituted by three units comprising temperature-sensitive elements, said units being specifically intended to respectively create one of the three parts I, II and III of the characteristic plotting the voltage $e$ as a function of temperature.

FIG. 3 schematically illustrates the regulating circuit which forms part of the invention.

Using an electrical power source which has not been shown and is connected between the terminals V and G, it creates on the one hand, at 7, a reference voltage which is fixed in operation and is applied to a terminal of the VARICAP across the resistor r, whose function has been explained earlier on, and on the other hand, at 8, the variable compensating voltage e applied to the other terminals of the VARICAP across the resistor r' whose function is the same as that of the resistor r.

This voltage is produced by three specific circuits I, II, and III connected between the terminals v of the power source and the terminal G, the internal resistance of which circuit depends upon the temperature. The circuit I furnishes a voltage which increases as a function of temperature but only at low temperatures; its action corresponds to the arc I of the graph shown in FIG. 2 and the increase in e becomes negligible at higher temperatures.

The circuit II connected at its output to the same point 34 as the circuit I, furnishes a voltage which decreases as a function of temperature, this however in the medium temperature range; below and above this range, the variation in e is negligible; it controls the arc II of the graph shown in FIG. 2. Finally, the circuit III applies to one of the terminals 35 of the circuit II, a voltage which is transmitted across this circuit to the common point between the circuits I and II, the law of variation of which voltage is once again a rising function of the temperature, this time however, in the high temperature range; in this way, the arc III of the graph shown in FIG. 2 is controlled.

The parameters governing the optimum attainment of the temperature ranges and the variation in e, depend upon the design of the circuits I, II and III which are now described.

FIG. 4 illustrates in more detail the circuit of FIG. 3 where the unit I is shown with its component parts, the other units II and III having been illustrated symbolically, in order to simplify matters, by the boxes 10 and 13, and being inoperative vis-a-vis the first temperature range considered.

This unit is connected between the two terminals +V and ground of the supply source and constitutes in association with the box 10 and a resistor R7 whose function will be described later on, a voltage-divider bridge the point 34 of which provides transmission to the terminal 8.

The division ratio of the bridge is variable as a function of temperature so that the voltage which it produces at the point 34 has a variation in accordance with the graph arm I shown at (a) in FIG. 4.

It is constituted by an element whose resistance varies as a function of temperature, or in other words a thermistor RT1 the influence of which is adjusted by an appropriate choice of the resistors $R_3$ and $R_4$.

In the low temperature range with which we are concerned here, the influence on the variations taking place in the resistance of those parts of the circuits shown by the boxes 10 and 13 is negligible since, as explained earlier, through a suitable choice of their elements they are designed to act in other temperature ranges.

The influence of the choice of the component parts of circuit I, is as follows:

At the lowest temperature, $RT_1$ is very much higher than $R_3$; the minimum voltage e depends above all on $RT_1$, $R_4$ and the resistance of 10; the maximum voltage e depends upon $R_3$ and V; finally, the slope $\alpha_1$ of the graph depends above all on $R_3$, $R_4$ and $RT_1$.

FIG. 5 illustrates the circuit of FIG. 3 in more detail, where the unit II specially designed to operate at medium temperatures, has been illustrated with its component parts, the units I and III having been illustrated symbocally by the boxes 11 and 13. These simplifications are legitimate for the reasons already explained earlier, the two units I and III being inoperative for the range of medium temperatures with which we are concerned at this juncture.

The unit II, connected between the two terminals +V and G of the supply source, constitutes in association with the box 11, a voltage-divider bridge, the point 34 of which ensures transmission to terminal 8.

The division ratio of the bridge is made variable as a function of temperature in the same manner described in the case of unit I, by arranging the thermistor $R_{T2}$ in series, the influence of which can be adjusted by the choice of the resistors $R_5$, $R_6$ and $R_7$.

In this way, the graph arc II shown in FIG. 2 and at (b) in FIG. 5, is produced.

At temperature $\theta_0$ of the graph in FIG. 2, $R_{T2}$ is very much higher than $R_5$. The maximum voltage e depends above all on $R_5$, $R_7$ and the resistance presented by the box 11.

At temperature $\theta_1$ in the same graph, the minimum voltage e depends above all on $R_5$, $R_7$ and $RT_2$ and the resistance of 11.

FIG. 6 illustrates in more detail the unit III, showing the component parts thereof.

Connected between the terminals +V and ground of the electrical power source, it applies to the end 35 of the common resistor $R_7$, whose function is thus justified, a partial compensating voltage which, across the box 10, representing the circuit ($RT_2$, $R_5$) of FIG. 5, produces the graph arc III of FIG. 2. To do so, it comprises an element of resistance variable as a function of the temperature $R_{T3}$, the influence of which is adjusted by the resistors $R_8$ and $R_9$.

Since the other parts of the circuit have no effect as far as the high temperature range involved is concerned, they are symbolised by boxes 10 and 11.

At temperature $\theta_1$ in the graph of FIG. 2, $R_{T3}$ is very much higher than $R_9$.

The minimum voltage e depends above all upon $R_7$, $R_8$ and $R_9$; the maximum voltage e depends upon $R_{T3}$, $R_7$, $R_8$ and +V and, finally the slope $\alpha_3$, shown at (c) of FIG. 6, depending above all on $R_8$, and $R_9$ and $R_{T3}$.

In addition, the precise temperature link at $\theta_1$, between the graph arcs II and III, as well as the optimum curvature at the point $\theta_1$, is achieved by the choice of $R_6$, $R_7$, $R_8$, $R_9$ and $R_{T3}$.

FIG. 7 illustrates the overall compensating circuit in accordance with the invention.

A detailed analysis has been given earlier in respect of each of the three units I, II, III and will not be repeated again in this description. However, it should be pointed out that the three divider bridges effectively constituted by the resistor sets ($R_1$, $R_2$), ($R_7$,$R_8$) on the one hand, ($R_{12}$, $R_{13}$) on the other, make it possible to adjust to the nominal operating conditions of the oscillator.

The resistors $R_1$ and $R_2$ thus, in the graph $e = f(\theta)$, control the maximum value of e for the value $\theta_0$; they can be replaced by resistors having voltage-regulating characteristics, for example zener diodes.

The resistors $R_7$ and $R_8$ control, along with $R_6$ and in the graph $e = f(\theta)$, the minimum value of $e$ for the value $\theta_1$; finally, the resistors $R_{12}$ and $R_{13}$ constitute elements which adjust the nominal frequency of oscillation.

The polarities of the terminals of the power source have been indicated purely by way of example in the figures; they correspond to known thermistors, devices whose resistance decreases when the temperature increases, and to a variable capacitance the value of which diminishes with any increase in the bias voltage applied to it. Self-evidently, the invention also includes within its scope the utilisation of components having the reverse characteristics with a consequent adaptation of the polarity signs of the terminals of the electrical power source.

The temperature-compensated oscillator in accordance with the invention, in a typical case offered by way of example, has presented a frequency stability of $1.10^{-6}$ within a wide temperature range extending from $-40°$ to $+80°$ C, a result which was obtained using components having values and characteristics which were not of a particular critical order.

Of course, the invention is not limited to the embodiment described and shown which was given solely by way of example.

What is claimed is:

1. A crystal-controlled oscillator whose frequency can be regulated within a wide range of temperatures and which comprises:
    an oscillating circuit in the form of a feedback loop, comprising an amplifier, a piezo-electric oscillator, and an element with a first pair of terminals, said element having a reactance which is variable as a function of an electrical signal applied to its terminals; and
    a compensating circuit with a second pair of terminals comprising temperature-sensitive elements, an electrical characteristic of which depends upon the temperature, said compensating circuit delivering at its terminals a compensating electrical signal, said first pair of terminals being connected to said second pair, wherein one of the terminals of the said second pair, in operation, is maintained at a fixed potential by a voltage divider, and the other is at an applied potential which is variable as a function of the temperature, and a first and second of said temperature-sensitive elements are connected by one of their ends to said other terminal, their other ends being respectively connected to two voltage dividers, of which one comprises a third one of said elements, the three dividers being adapted to be connected to the terminals of an electrical energy source.

2. A crystal-controlled oscillator as claimed in claim 1, wherein said temperature-sensitive elements provide to the said electrical compensating signal, within its range of variation as a function of increasing temperatures, first and third portions of rising values corresponding to the ends of said range, and a second portion produces the decreasing values corresponding to the intermediate part of said range.

3. A crystal-controlled oscillator as claimed in claim 1, wherein each of the three temperature-sensitive elements is respectively connected through a resistor shunted across its ends.

4. A crystal-controlled oscillator as claimed in claim 1, wherein each of the terminals of said first pair is connected to each of the terminals of said second pair through a resistor which has a high resistance compared with that of the voltage dividers.

5. A crystal-controlled oscillator as claimed in claim 1, wherein said temperature-sensitive elements have a resistance which decreases as a function of temperature, said third element being connected to the positive terminal of said electrical energy source.

* * * * *